(12) United States Patent
Raghuraman et al.

(10) Patent No.: US 10,522,236 B2
(45) Date of Patent: Dec. 31, 2019

(54) FUSEBOX-BASED MEMORY REPAIR USING REDUNDANT MEMORIES

(71) Applicant: QUALCOMM Incorporated, San Diego, CA (US)

(72) Inventors: Praveen Raghuraman, Chennai (IN); Vaishnavi Sundaralingam, Bangalore (IN); Madhura Hegde, Bangalore (IN); Nikhil Sudhakaran, Palakkad (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/081,640

(22) Filed: Mar. 25, 2016

(65) Prior Publication Data
US 2017/0278583 A1 Sep. 28, 2017

(51) Int. Cl.
G11C 29/12 (2006.01)
G06F 3/06 (2006.01)
G06F 11/07 (2006.01)
G11C 17/16 (2006.01)
G11C 17/18 (2006.01)
(Continued)

(52) U.S. Cl.
CPC ............ G11C 29/12 (2013.01); G06F 11/073 (2013.01); G06F 11/0793 (2013.01); G11C 17/16 (2013.01); G11C 17/18 (2013.01); G11C 29/44 (2013.01); G11C 29/4401 (2013.01); G11C 29/785 (2013.01); G11C 2029/4402 (2013.01)

(58) Field of Classification Search
CPC ......... G11C 29/12; G11C 29/36; G11C 29/38; G11C 29/44; G11C 29/4401; G11C 29/4402; G11C 29/56; G11C 29/56008; G11C 29/70; G11C 29/78; G11C 29/785; G11C 29/787; G11C 29/80; G11C 29/812; G11C 17/16; G11C 17/18; G11C 2029/4402; G06F 3/0619; G06F 3/0653; G06F 3/0683; G06F 11/07; G06F 11/16; G06F 11/1666; G06F 11/20; G06F 11/2017; G06F 11/2053; G06F 11/2094; G06F 11/073; G06F 11/0793
See application file for complete search history.

(56) References Cited

U.S. PATENT DOCUMENTS 6,681,359 B1    1/2004  Au et al.
7,415,640 B1 *  8/2008  Zorian ................... G11C 29/44
                                                          365/200
(Continued)

Primary Examiner — Kyle Vallecillo
(74) Attorney, Agent, or Firm — Loza & Loza, LLP

(57) ABSTRACT

A method and apparatus for repairing a memory is provided. At least one memory is tested using a production test pattern. After the production test, a passing or failing status is determined for each memory tested. This determination may be made using a built-in repair analysis (BIRA) program. After the analysis the location of each failing memory is determined. A fuse register pattern is then determined for the failing memory, and at least one fuse is blown to repair the failed memory. The repair utilizes at least one of the redundant memories present in the semiconductor device. The apparatus includes a semiconductor device having repairable memories, a fuse programmable read-only memory (FPROM) that contains multiple redundant memories, and a fuse box memory repair apparatus that is in communication with the FRPOM and the multiple repairable memories.

17 Claims, 11 Drawing Sheets

(51) Int. Cl.
*G11C 29/44* (2006.01)
*G11C 29/00* (2006.01)

(56) References Cited

U.S. PATENT DOCUMENTS

| | | |
|---|---|---|
| 8,145,958 B2 | 3/2012 | Aitken et al. |
| 8,719,648 B2 | 5/2014 | Gorman et al. |
| 2002/0145921 A1* | 10/2002 | Jones ................ G11C 29/812 365/200 |
| 2007/0079052 A1* | 4/2007 | Hasegawa ............ G11C 29/54 711/100 |
| 2013/0031319 A1* | 1/2013 | Gorman ............... G11C 29/785 711/157 |
| 2013/0080847 A1* | 3/2013 | Zorian ................. G11C 29/32 714/718 |

* cited by examiner

NON-HMID BASED FUSEBOX

| ENB0 | SELECT0 [7:0] | COL0 [5:0] |
|---|---|---|

| ENB3 | SELECT 3 [7:0] | COL 3 [5:0] |
|---|---|---|

FIG. 5

HMID BASED FUSEBOX

| ENB0 | HM0 [2:0] | SELECT0 [5:0] | LEFT/RIGHT | COL0 [5:0] |
|---|---|---|---|---|

| ENB3 | HM3 [2:0] | SELECT 3 [5:0] | LEFT/RIGHT | COL 3 [5:0] |
|---|---|---|---|---|

FIG. 6

FUSEBOX-BASED MEMORY REPAIR USING REDUNDANT MEMORIES

BACKGROUND

Field

The present disclosure relates generally to wireless communication systems. More specifically the present disclosure related to methods and apparatus for fuse box-based memory repair.

Background

Wireless communication devices have become smaller and more powerful as well as more capable. Increasingly users rely on wireless communication devices for mobile phone use as well as email and Internet access. At the same time, devices have become smaller in size. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipment, and similar terms.

These wireless communication devices typically use a system-on-chip (SoC) to provide many of the functions of the device. A SoC is an integrated circuit that combines all components of a computer or other electronic system on a single chip. The SoC device may contain digital, analog, mixed-signal, and radio frequency (RF) functions on a single substrate. SoCs are used widely due to their low power consumption.

A SoC may consist of a microcontroller or digital signal processor (DSP) core, memory blocks including a selection of ROM, RAM, EEPROM, and flash memory, as well as timing sources. The timing sources may include oscillators and phase-locked loops (PLL). Peripherals, including counter-timers, real-time timers, and power-on reset generators may also be incorporated. A wide variety of external and internal interfaces including analog-to-digital (ADC), digital-to-analog converters (DAC), voltage regulators and power management circuits are also typically included in a SoC. The desired performance of the end device may result in different mixes of the above functions to be included in the SoC. The SoC also includes a bus system for connecting the various functional blocks.

Testing all of the SoC components is needed to ensure that all electronic devices incorporated into user devices function correctly. This testing may be time-consuming and expensive. Most SoCs have multiple memories which may be organized into hierarchies of caches. Memories in SoCs may be tested using built-in self-test (BIST) controllers. For processors in the sub-20 nm range, the majority of failures discovered during BIST testing are single bit failures. These single bit failures may be repairable. Repairs may be accomplished using redundant rows and columns built into the memory. These redundant elements are enabled by blowing a fuse, which repairs the memory. This repair process may be improved by using a multi-way fuse decoder box for fuse box based memory repair. A multi-way or m-way fuse decoder box facilitates repair of multiple memories with a limited number of fuses.

There is a need in the art for a method and apparatus to allow repair of memory defects using a m-way fuse box-based approach.

SUMMARY

Embodiments described herein provide a method for repairing a memory. The method begins when at least one memory is tested using a production test pattern. This testing may be accomplished with memory built-in self-test (MBIST). After the production test, a passing or failing status is determined for each memory tested. This determination may be made using a built-in repair analysis (BIRA) program. After the analysis the location of each failing memory is determined. A fuse register pattern is then determined for the failing memory, and at least one fuse is blown to repair the failed memory. The repair utilizes at least one of the redundant memories present in the semiconductor device.

An additional embodiment provides an apparatus for repairing a memory. The apparatus includes a semiconductor device having repairable memories, a fuse programmable read-only memory (FPROM) that contains multiple redundant memories, and a fuse box memory repair (FMR) apparatus that is in communication with the FPROM and the multiple repairable memories. The FMR is configured to: determine one or more locations of memory failures in the at least one multiple repairable memory; determine a fuse register pattern comprising one or more fuse input control vectors indicative of the determined one or more locations for the at least one repairable memory; and blow at least one fuse to repair the at least one repairable memory based on the fuse register pattern.

A further embodiment provides an apparatus for repairing a memory. The apparatus includes: means for testing at least one memory using a production test pattern; means for determining a passing or failing status for the at least one memory; means for determining if at least one memory failed; means for determining the location of the failed memory; means for determining a fuse register pattern for the failed memory; and means for blowing at least one fuse to repair the failed memory.

BRIEF DESCRIPTION OF THE DRAWINGS

FIG. 5 depicts a call for a non hard macro identifier (HMID) based fuse box repair, in accordance with embodiments disclosed herein.

FIG. 6 depicts a call for a HMID based fuse box repair, in accordance with embodiments disclosed herein.

DETAILED DESCRIPTION

Figure 1:
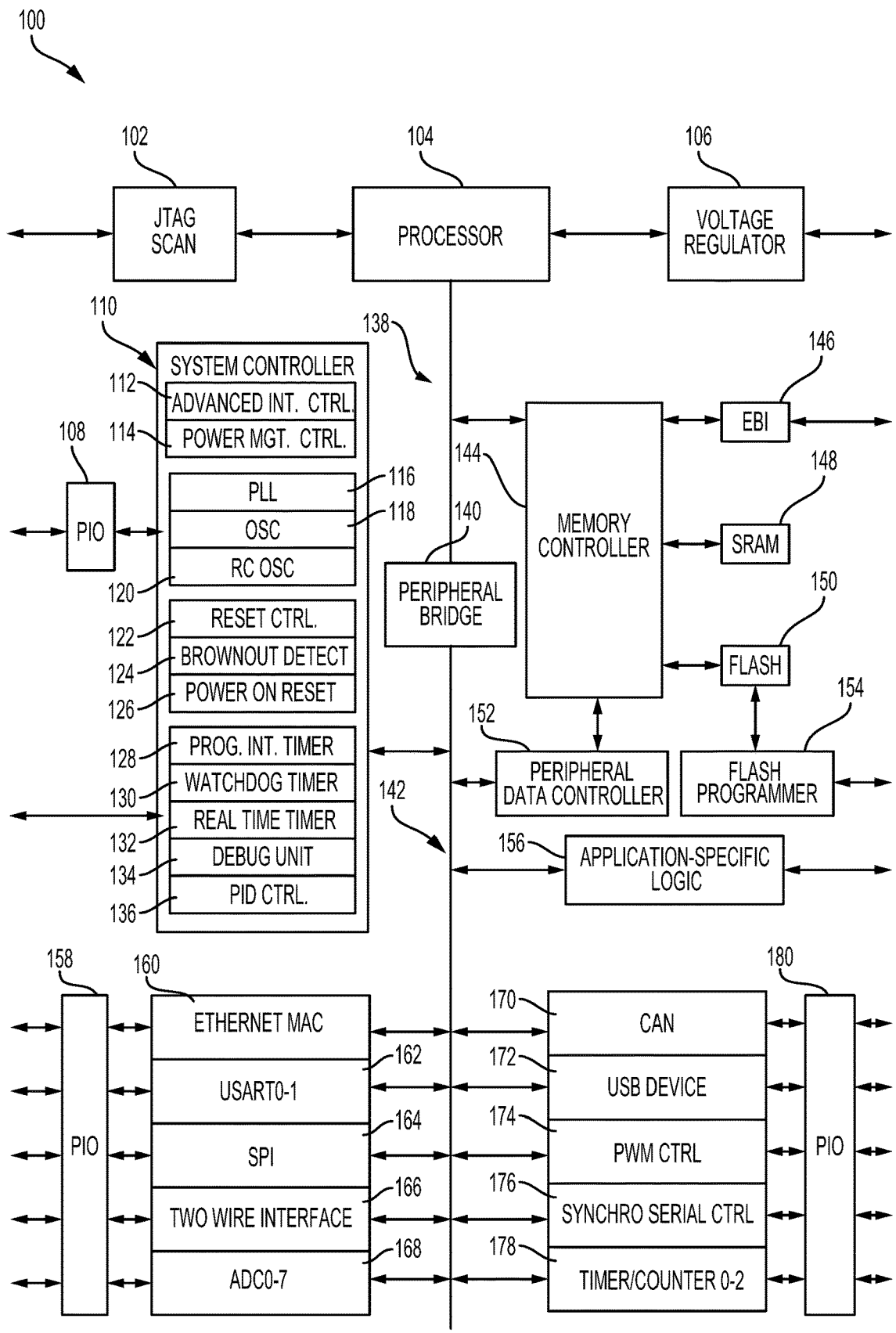
FIG. 1 is a block diagram of a SoC, in accordance with embodiments disclosed herein.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

As used herein, the term "determining" encompasses a wide variety of actions and therefore, "determining" can include calculating, computing, processing, deriving, investigating, looking up (e.g., looking up in a table, a database or another data structure), ascertaining and the like. Also, "determining" can include resolving, selecting choosing, establishing, and the like.

The phrase "based on" does not mean "based only on," unless expressly specified otherwise. In other words, the phrase "based on" describes both "based only on" and "based at least on."

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The various illustrative logical blocks, modules, and circuits described in connection with the present disclosure may be implemented or performed with a general purpose processor, a digital signal processor (DSP), an application specific integrated circuit (ASIC), a field programmable gate array (FPGA), or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM, and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage, or other magnetic storage devices, or any other medium that can be used to carry or store desired program code in the form of instructions or data structures and that can be accessed by a computer. Disk and disc, as used herein, includes compact disk (CD), laser disk, optical disc, digital versatile disk (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated by FIGS. 2-11, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

Embodiments described herein provide a hard macro identifier (HMID) based fuse box and a non-HMID based fuse box. In each case, a pre-tape out validation check and an automated test equipment (ATE) initiation may be needed to begin the fuse box based memory repair process. The process may allow for memories to be repaired using only a few fuses and also to help ensure that the design is fully verified. The fuse box memory repair (FMR) logic receives input from the memory to be tested and then interfaces with the repairable memories. The FMR provides independent memory repair. A number of fuse bits are reserved in the read-only memory (ROM). Four sets of fuse bits are used in the fuse box and eight bits are reserved for the repair. A variable number of columns may be used. The failing column is determined and located and is then known as the select column for the duration of the repair process. The repair bit is set to 1. Fuse connectivity validation is then performed to ensure connectivity from the fuse programmable read-only memory (FPROM) to the memory redundancy port at the memory level. The approach may be validated on a virtual tester simulation environment. The FMR is also check with each fuse vector set to the physical memory redundancy port and every physical memory instance covered.

A SoC is an integrated circuit that combines all components of a computer or other electronic system on a single chip. It may contain digital, analog, mixed-signal, and radio frequency (RF) functions. A SoC may consist of: a microcontroller or digital signal processor (DSP) core; memory blocks, including a selection of read-only memory (ROM), random access memory (RAM), electrically erasable programmable read-only memory (a type of non-volatile memory), and flash memory; timing sources including oscillators and phase-locked loops (PLL); peripherals including counter-timers, real-time timers, and power-on or reset generators; external interfaces; analog interfaces including analog to digital converters (ADC), digital to analog converters (DAC); voltage regulators; and power management circuits. A bus connects these blocks within the SoC.

Many SoCs incorporate an Acorn Risc Machine (ARM) proprietary process into their architecture. A reduced instruction set computing (RISC) device may be used as a building block within a larger and more complex device, such as a SoC. The ARM processors may be configured for various environments. A RISC based design means that ARM processors require significantly fewer transistors than a complex instruction set computing (CISC) device, such as those found in most personal computers. This approach results in lower cost, less heat production, and less power consumed. As a result, ARM processors are used extensively in portable devices such as wireless devices and tablet, as well as in embedded systems. ARM processors use a simpler design with more efficient multi-core central processing units (CPU).

An ARM processor core may support a 32-bit address space and use 32-bit arithmetic. Other processors may also be used in place of the ARM processor. Instructions for ARM cores often use 32-bit wide fixed length instructions, however, some versions support a variable length instruction set that uses 32-bit and 16-bit wide instruction sets for improved code density. In many cases, a SoC will use the standard ARM processor core and will use a 32-bit address space and 32-bit arithmetic. However, some SoCs allow for a reduction in memory size by blowing a fuse. This process of reducing memory size by blowing a fuse is known as de-featuring. As an example, in one SoC core, the cache may be reduced from 1 MB to 512 KB during the manufacturing process. This allows a simple memory size reduction without the time and expense of a redesign.

FIG. 1 illustrates a SoC, 100. The assembly 100 includes joint test action group (JTAG) scan device 102, which receives input signals for scanning. These signals are scanned before being sent to the ARM processor 104. The ARM processor 104 may also send input to JTAG scan device 102, which in turn may provide output. The ARM processor also interfaces with voltage regulator 106. The SoC 100 may also incorporate a first peripheral input/output interface (PIO) 108. This PIO 108 interfaces with a system controller 110. System controller 110 may incorporate an advanced interface controller 112, a power management controller 114, a phase locked loop (PLL) 116, an oscillator 118, a resistor-capacitor (RC) oscillator 120, a reset controller 122, a brownout detector 124, a power on reset device 126, a program interrupt timer 128, a watchdog timer 130, a real time timer 132, a debug unit 134, and a proportional/integral/derivative (PID) controller 136. All of the devices under the control of system controller 110 interface through the PIO.

The ARM processor 104 interfaces with peripheral bridge 140, which also provides input and output interface with the system controller 110. The peripheral bridge communicates with multiple components using an application peripheral bus (APB) 142. An internal bus 138 operates in conjunction with the peripheral bridge 140 to communicate with additional devices within the SoC 100. The internal bus 138 may be an application specific bus (ASP) or an application handling bus (AHB). Memory controller 140 interfaces with ARM processor 104 using internal bus 138. The memory controller 140 also communicates with the external bus interface (EBI) 146. Memory controller 140 is also in communication with static random access memory (SRAM) 148, and flash memory 150. Flash memory 150 is in communication with flash programmer 154. The memory controller 144 is also in communication with peripheral data controller 152. Additional application specific logic 156 communicates with the internal bus 138 and may also have external connections. A second PIO 158 provides communication with an Ethernet medium access control (MAC) 160. The second PIO 158 also communicates with a universal asynchronous receiver/transmitter 162, a serial peripheral interface (SPI) 164, a two-wire interface 166, and an analog to digital converter 168. These devices and interfaces connect through internal bus 138 with a controller area network bus (CAN) 170, a universal serial bus (USB) devices 172, a pulse width modulator (PWM) controller 174, a synchro serial controller 176, and a timer/counter 178. These devices, CAN 170, USB device 172, PWM controller 174, synchro serial controller 176 and timer/counter 178 interface with third PIO 180, which provides external input and output. While these elements are typical of many SoCs, other devices may be incorporated, and some may not be included.

Testing the SoC may be a part of the manufacturing process. Automated test equipment (ATE) is used to perform tests on a device, known as the device under test (DUT), using automation to quickly perform measurements and evaluate test results. An ATE may be a simple computer-controlled digital multimeter, or may be a more complex system with many test instruments capable of testing and diagnosing faults in SoCs. ATE systems are designed to reduce the amount of test time needed to verify that a particular electronic device functions correct, or to quickly find the faults before the device is installed in an end product, such as a wireless device. An ATE system may consist of a master controller (often a computer) that synchronizes one or more capture instruments.

Figure 2:
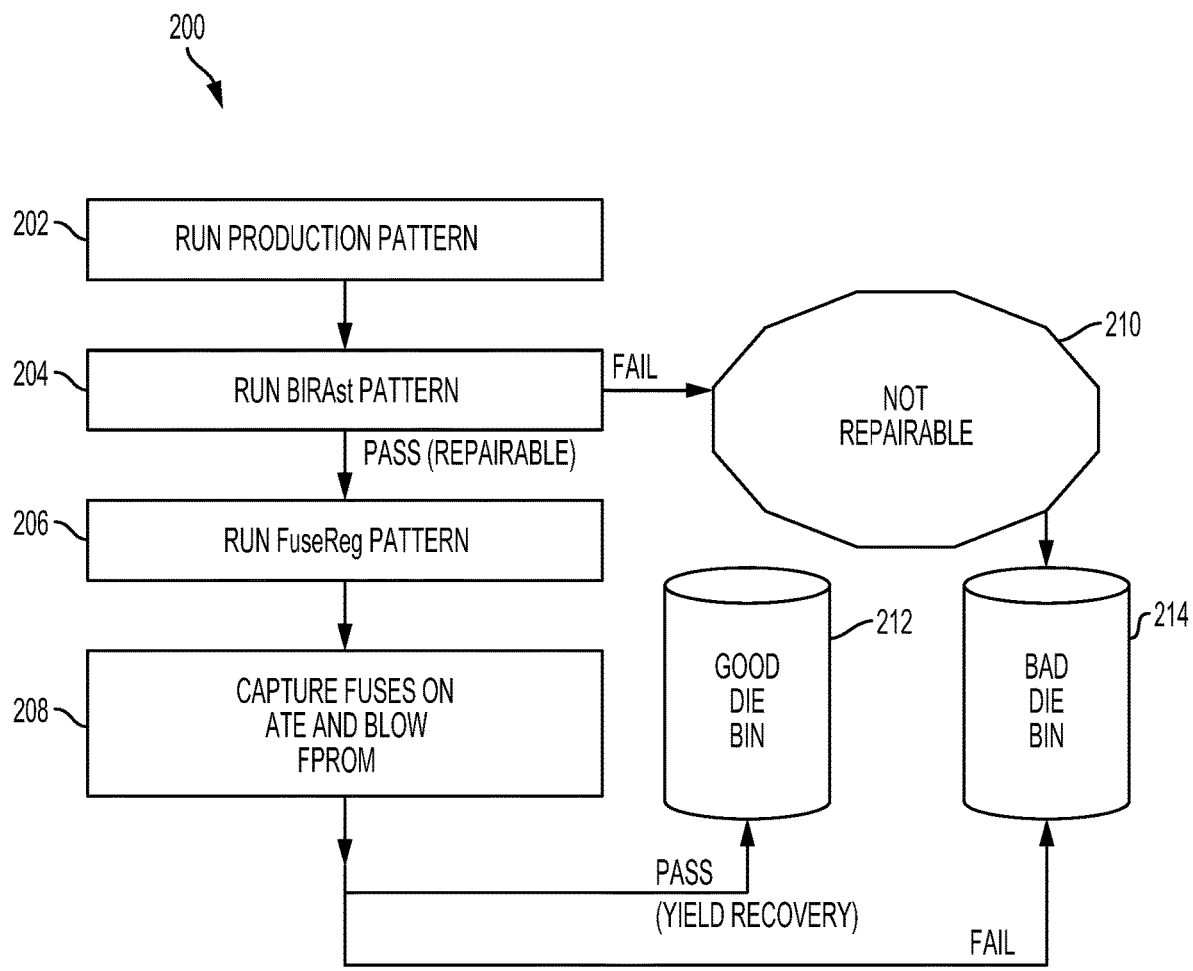
FIG. 2 is a flowchart of an overview of a method of repairing a memory using a fuse box based approach, in accordance with embodiments disclosed herein.

FIG. 2 is a flow diagram of the processes involved in ATE memory repair. The method 200 begins with block 202 where a production pattern is run for the devices. This pattern may be a test program designed specifically to exercise each of the features of the device. The production pattern may examine all of the memories on a device to look for failures. Once the production pattern is run in block 202, a built-in repair analysis (BIRA) pattern may be run. The BIRA determines which of the memories that fail which may be repaired and which cannot. The BIRA pattern results in some device proceeding to further analysis in block 206, while others are deemed not repairable and removed in block 210. The memories that may be repaired proceed to block 206, where a fuse register pattern is run. This fuse register pattern determines which fuses may be used to repair a memory on the device. In block 208 the fuses are determined based on the ATE test results and these fuses are then blown on the fuse programmable read only memory (FPROM) during block 208. Once the selected fuses have been blown, the production test pattern is run again to determine if the memories have been repaired. Successfully repaired memories are placed in the good die bin in block 212. Memories that are not successfully repaired are placed in the bad die bin in block 214. The bad die bin also receives the memories that were not suitable for repair in block 204.

Memories in semiconductor chips may be tested using BIST controllers. During this testing, the memories are tested at the specific frequencies that will be encountered during normal device use. The memory defects discovered during BIST testing, which may be single bit failures, may be successfully repaired. This repair provides production run yield recovery once the redundant repair fuses are blown. With the redundant memories and the fuse box repair process increased redundancy is built into each semiconductor device or chip. The fuse box based memory repair process described in greater detail below provides independent logic and allows repair of many memories using only a few fuses.

A conventional computer memory may be thought of as an array of cubbyholes, each of which may contain a piece of information. Each cubbyhole has a unique name, called its address of location. Typical memory systems provide two primitive operations: one that fetches the data stored in a specified location and one that assigns new data to a specified location. Memory addresses may be incremented to support sequential access to some set of the cubbyholes. More generally, many important data operations require that memory address be treated as data, which may be stored in memory locations and manipulated in machine registers. The representation of list structure is one application of such address arithmetic.

To model computer memory, a kind of data structure called a vector may be used. Abstractly, a vector is a compound data object whose individual elements may be accessed by means of an integer index in an amount of time that may be independent of the index. Two primitive scheme procedures may be used to manipulate vectors:
(vector-ref vector n) returns the nth element of the vector.
(vector-set! vector n value) sets the nth element of the vector to the designated value.
For example, if v is a vector, then (vector-ref v 5) gets the fifth entry in the vector v and (vector-set! v 5 7) changes the value of the fifth entry of the vector v to 7. For computer memory this access may be implemented through the use of address arithmetic to combine a base address that specifies the beginning of a vector in memory with an index that specifies the offset of a particular element of the vector.

Figure 3:
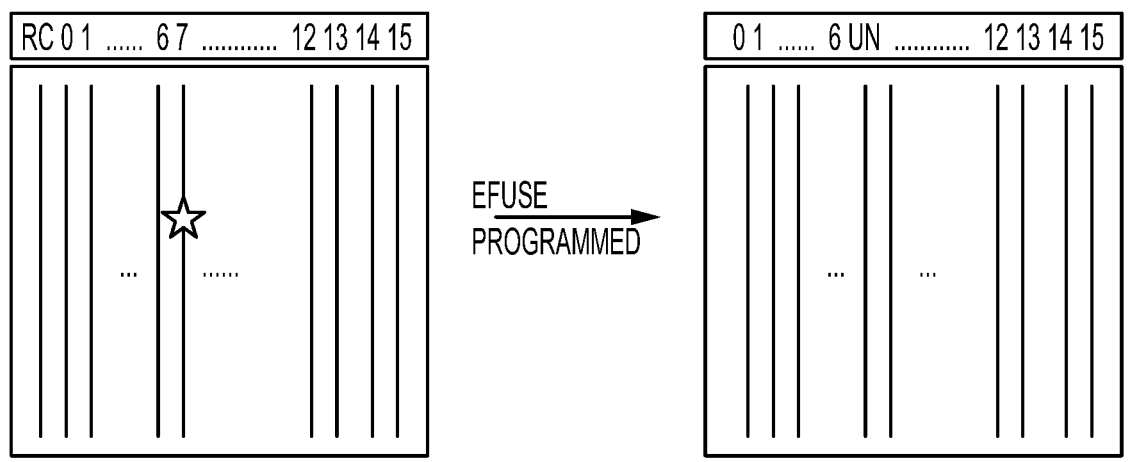
FIG. 3 illustrates row and column fuse box based repair of a memory, in accordance with embodiments disclosed herein.

FIG. 3 depicts a high-level overview of the repair process. In the diagram on the left, a defect has been found in column 7. Using the fuse box based repair process, an electronic fuse, or eFuse, is programmed. After repair the column containing the defect, column 7 is not used, and a reserved column is used in place of column 7.

Figure 4:
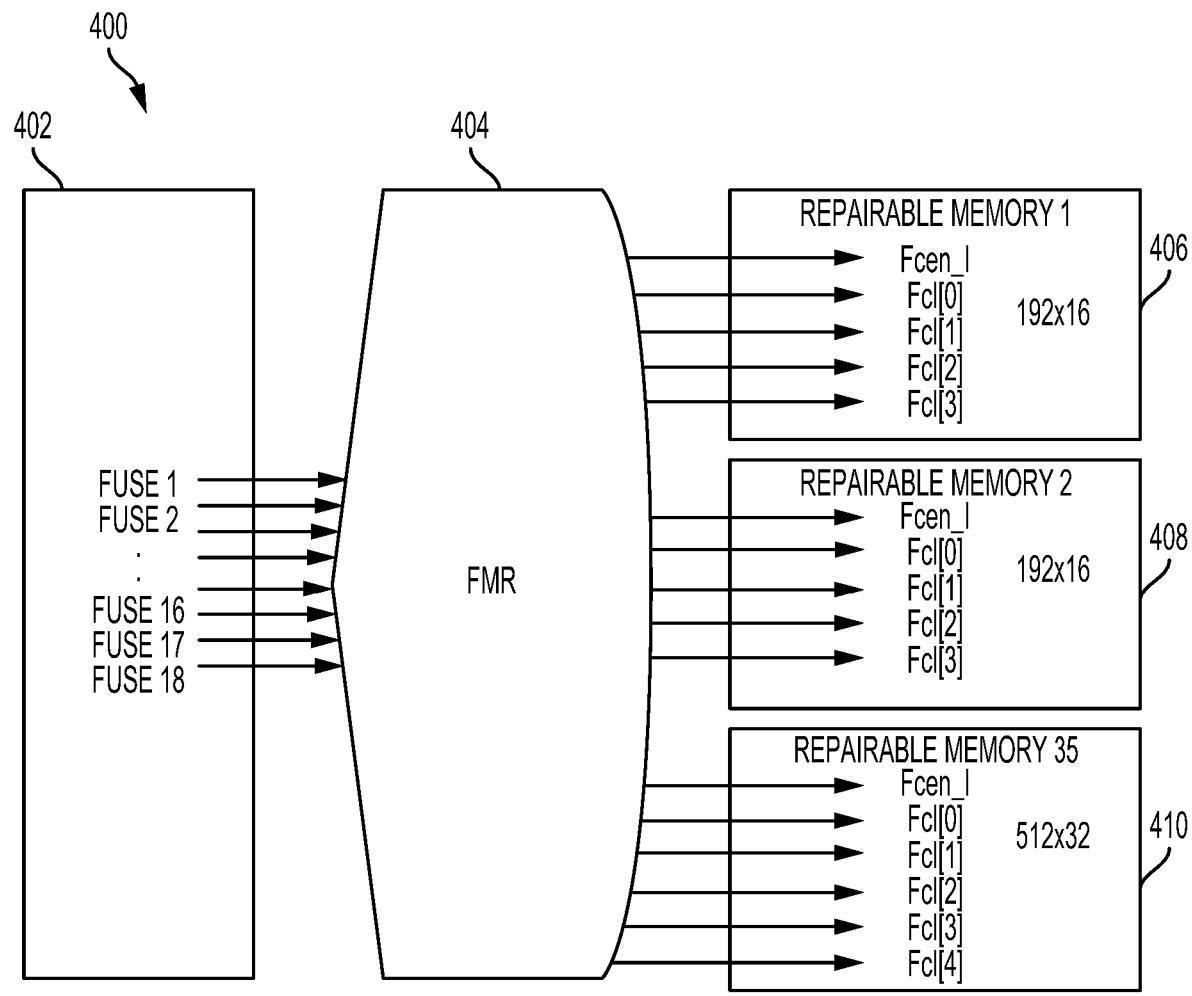
FIG. 4 is a block diagram of an apparatus for fuse box based memory repair, in accordance with embodiments disclosed herein.

FIG. 4 is a block diagram of a FMR interface 400. The FPROM memory 402 includes a series of fuses numbered from Fuse 1 to Fuse N. FIG. 4 illustrates up to Fuse 18, however, the number of fuses may be adjusted depending on the number of memories present on the semiconductor device. The FPROM memory 402 interfaces with FMR 404. FMR 404 provides the interface between the series of fuses 402 and the repairable memories 406, 408, and 410. Each repairable memory 406, 408, and 410 includes multiple fuse columns. As shown, repairable memory 406 includes fuse enable logic and fuse columns 1-3. While repairable memory 406 is depicted as a 192×16 memory, other memory sizes having different numbers of fuse columns may also be used without departing from the scope of the embodiments described herein. FIG. 4 shows that each memory 406, 408, and 410 may be repaired independently, as each memory contains separate fuse enable logic and fuse columns.

FIG. 5 illustrates the addressing for enabling fuse box based memory repair in a system without hard macros. In addition, FIG. 5 shows how the instances and columns needing repair are selected. FIG. 5 shows the addressing used when a fuse box that is not based on hard macros is used. The decoder implementation shown in FIG. 5 facilitates repair of many memories with the limited number of fuses provided in the FPROM. A number of fuse bits are reserved in the FRPOM. In this example there are four bits used in the fuse box. In many devices, eight bits may be reserves for repair, however, different devices may requires different numbers of reserved repair bits. A variable number of columns for repair may be provided, depending on the semiconductor design. The address logic shown is used to locate the failing column. The vector is a 15 bit fuse vector with fields for enable, instance select and column. Vector 0 is a repair vector with an enable field, a select0[7:0] field that provides a pointer to the specific location of the failing memory. The column select, col0[5:0,] field provides a pointer to the column needed for the repair. A similar vector 3 is shown for a different failure. With these vectors, the FMR is able to blow the specific fuses needed to repair the failing memories.

Many semiconductor devices incorporate hard macros (HM). A hard macro is a custom block that is used in digital logic. A hard macro may be fixed in size. Hard macros may be stored in memory, which carries a dedicated single function. In many cases, hard macros for specific custom functions may be included within a SoC and these must be tested during MBIST and other device functionality testing.

FIG. 6 illustrates the addressing for enabling fuse box based memory repair in a system including hard macros. FIG. 6 shows how the instances and columns needing repair are selected. The vector is a 17 bit fuse vector with fields for enable, hard macro indicator, select, left/right, and column. A similar hard macro identifier (HMID) vector 3 covering a different fuse box based memory repair instance is also shown.

Figure 7:
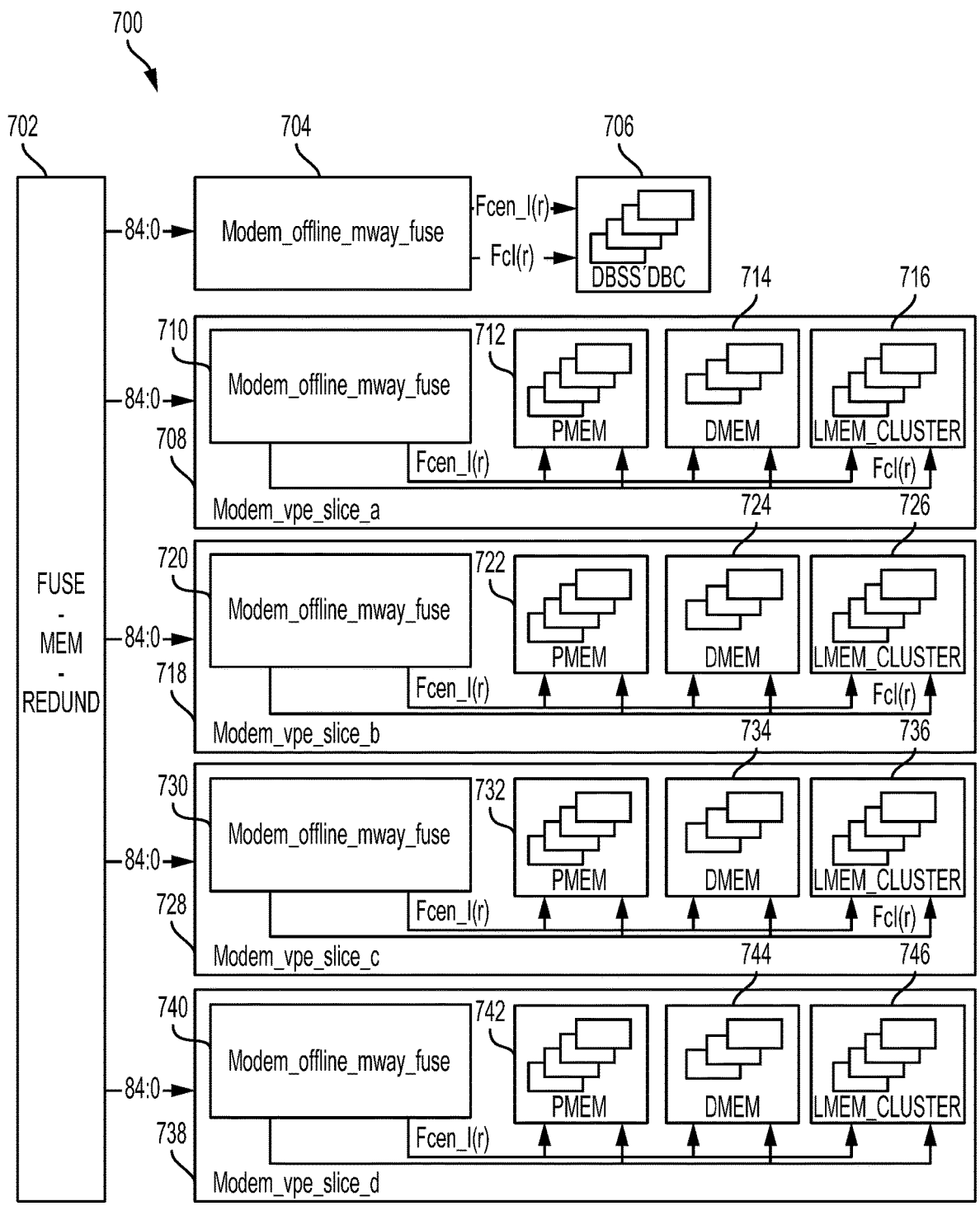
FIG. 7 is a block diagram of a processor containing multiple memories that may be repaired using fuse box based repair methods, in accordance with embodiments disclosed herein.

FIG. 7 is a block diagram of a semiconductor device containing multiple memories and incorporating a multiple-way, or m-way fuse decoder. The semiconductor 700 includes redundant fuse memories 702. These redundant fuse memories are connected with modem offline m-way fuses 704, 710, 720, 730, and 740. Modem offline m-way fuse 704 is also connected to multiple memories 706. Each modem 708, 718, 728, and 730 includes a modem offline m-way fuse 710, 720, 730, and 740. In addition, each modem 708, 719, 729, and 739 contains multiple memories, including program memories (PM) 712, 722, 732, and 742, data memories (DM) 714, 724, 734, and 744, as well as local memory (LM) clusters 716, 726, 736, and 746. As shown in FIG. 7, there are five hard macros present in the modem system. Each hard macro has a dedicated fuse box for memory repair. Each fuse box may contain seventeen fuses. Based on the SoC design, different numbers of each component may be required, and the embodiments described herein are not limited to the specific design discussed. The fuse box incorporates decoding logic and may provide complete repair coverage of all of the memories, including the 32 instances of local memory, four instances of program memory, and three data memory instances.

Figure 8:
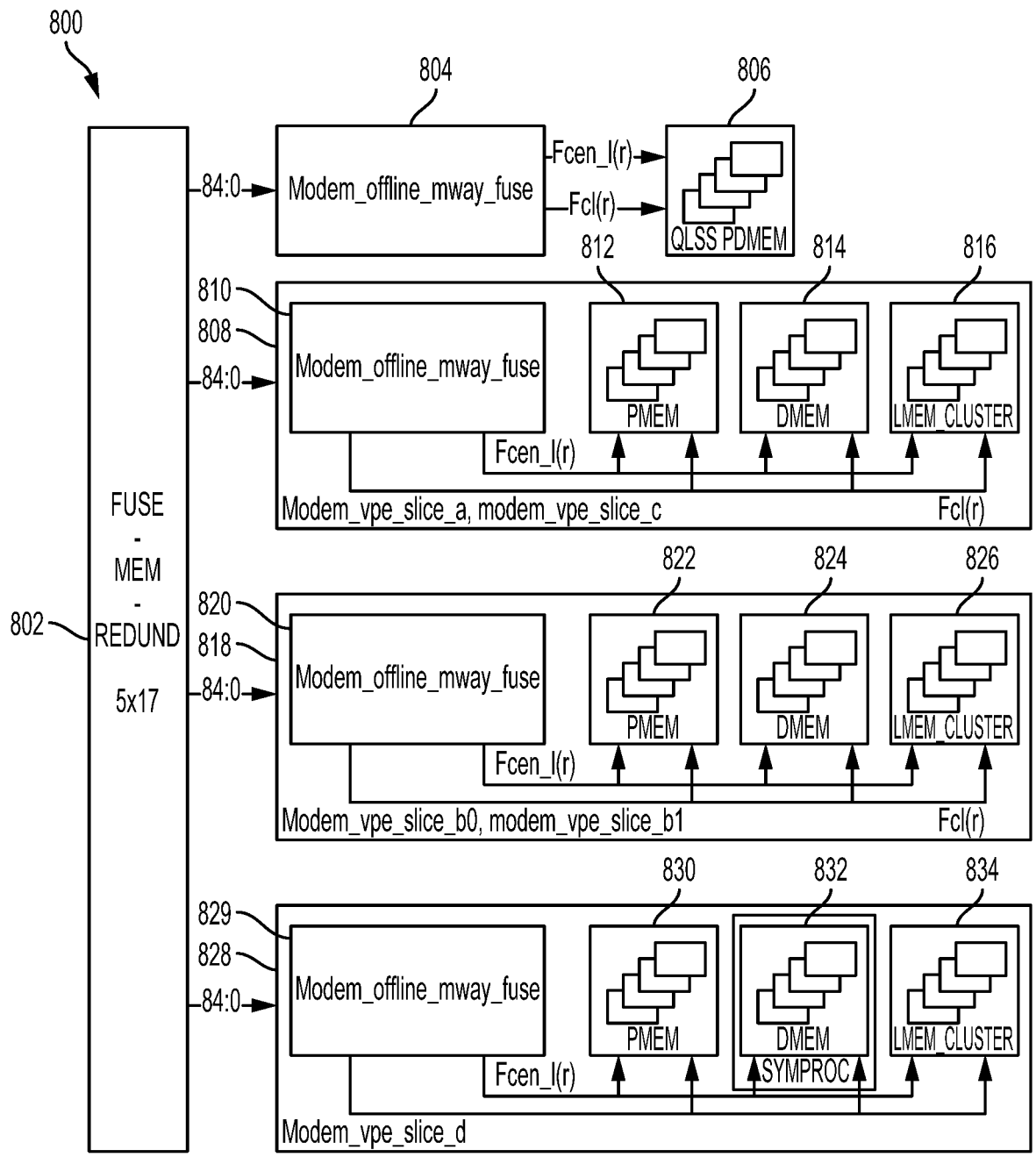
FIG. 8 is a block diagram of an alternative processor containing multiple memories that may be repaired using fuse box based repair methods, in accordance with embodiments disclosed herein.

FIG. 8 illustrates a further example SoC device that may be used with a HMID fuse box based memory repair method. The SoC 800, includes redundant fuse memories 802. These redundant fuse memories 802 are connected to multiple modems 808, 818, and 828. A modem offline m-way fuse 804 is connected to program data memories (PDMEM) 806. Modems 808, 818, and 828 each incorporate modem offline m-way fuses 810, 820, and 829. Logic within the m-way fuse boxes 810, 820, and 820 provides for column enable to facilitate the repair for the specific failing modem memory. The memories that may be repaired includes PMEMs 812, 822, and 830, DMEMs 814, 824, and 832, and LMEM clusters 816, 826, and 834. FIG. 8 depicts a SoC having seven hard macros present in the modem subsystem and provides a total of 85 fuses for repair. Decoding logic in the fuse box determines the specific memory and location requiring repair and ensures that the fuse is blown to repair the memory.

A fuse connectivity validation may be performed before device tape out to ensure connectivity from the FPROM (at the security control level) to memory redundancy port (at the memory level). These exhaustive checks ensure the every fuse vector is tested and set to a physical memory redundancy port and every physical memory instance is covered.

Figure 9:
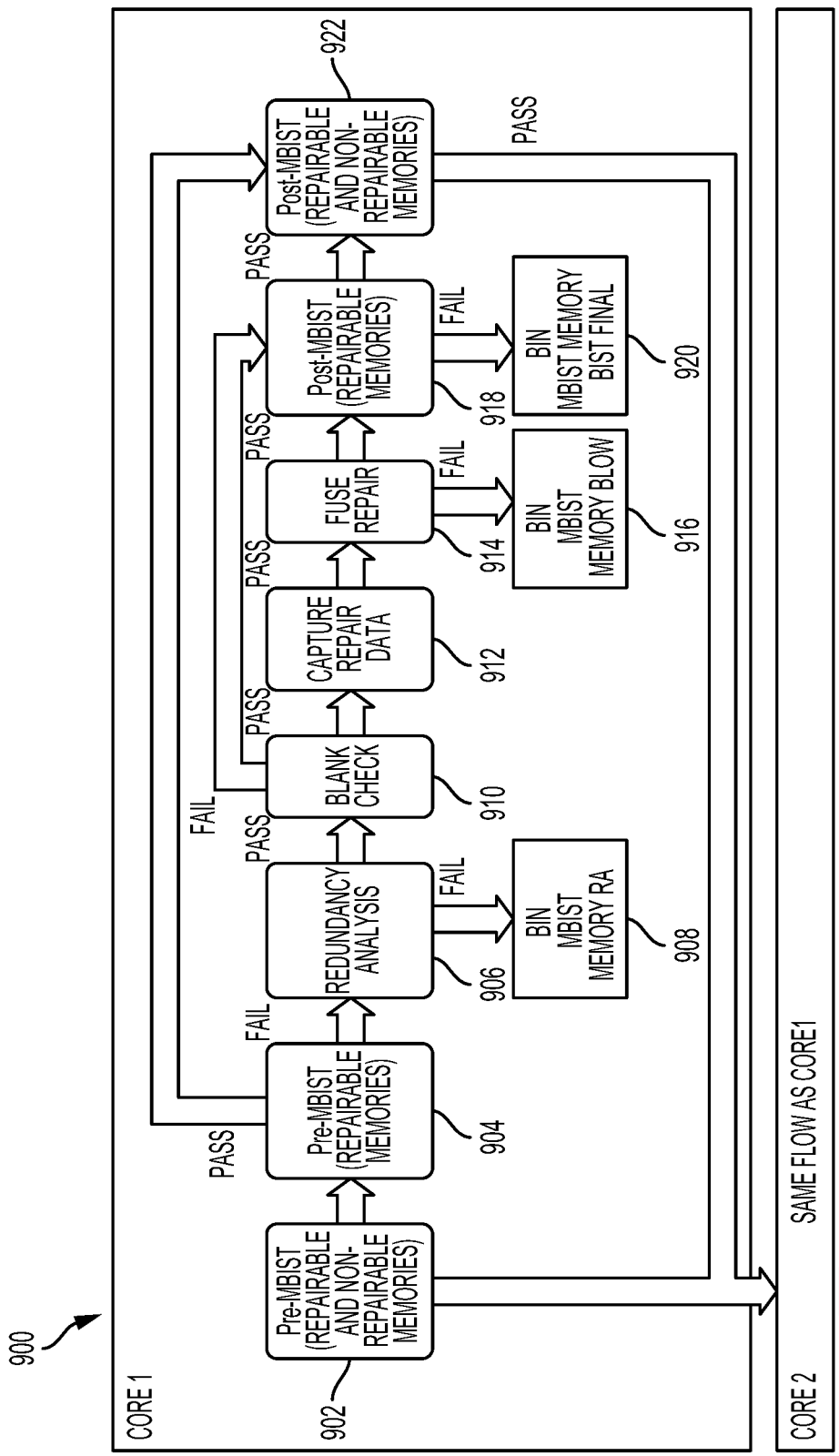
FIG. 9 is a flowchart of a method of fuse box based memory repair, in accordance with embodiments disclosed herein.

FIG. 9 shows a flowchart of a memory repair process 900 using the fuse box based method described herein. For each core a set of devices is gathered before memory BIST (MBIST) testing in block 902. This set of cores undergoes MBIST testing and the passing and failing memories are determined in block 904. Passing memories proceed to block 922 and the next core test begins. Failing memories undergo redundancy analysis in block 906. Devices that fail redundancy analysis in block 906 are binned as unrepairable in block. Repairable devices proceed to blank check in block 910. Passing devices proceed to block 912. Repair data is then captured in block 912. Failing devices at blank check block 910 are passed to the repeat MBIST testing block 922, where they are again analyzed. Devices that pass the capture block 912 undergo fuse repair in block 914. Devices that fuse repair cannot be completed are binned as MBIST core block in bin 916. The newly repaired memories that successfully complete fuse repair in block 914 then undergo MBIST testing again, in block 918. Devices that fail MBIST testing in block 918 are binned as final in block 920. The passing MBIST repairable and non-repairable memories are noted in block 922. Testing then proceeds to the next core on the SoC.

Figure 10:
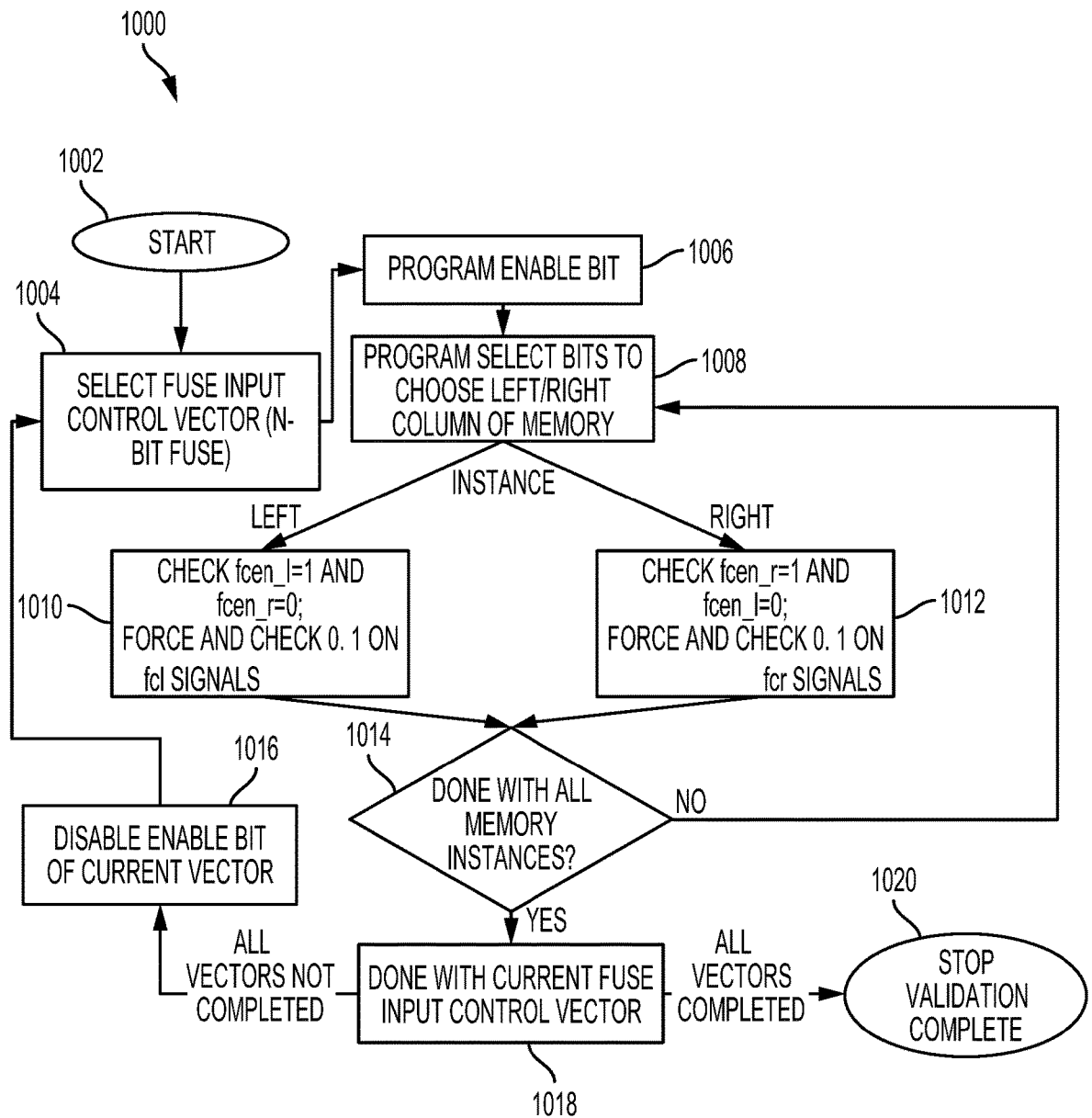
FIG. 10 is a flowchart of a non-HMID memory repair method, in accordance with embodiments disclosed herein.

FIG. 10 is a flowchart of a non-HMID based verification flow 1000. The method begins at start block 1002. A fuse input control vector for an N-bit fuse is selected in block 1004. For example, the N-bit fuse may be a 15 bit fuse. The program enable bit is then set in block 1006. The select bits are then programmed in block 1008 to choose either the left or right column of memory. If the left column of memory is chosen in block 1008, then in block 1010 a fuse column enable bit left is set to 1 and the fuse column enable biright is set to 0. A force and check for the above bit setting is also performed. If the right column of memory is chosen in block 1008 then the fuse column enable right bit is set to 1 and the fuse column enable left bit is set to 0 in block 1012. In the force and check step the memory is pushed to function as it would normally and a normal operation test is then performed. A force and check for the above settings is also performed in block 1012. Once these settings are established, in decision block 1014 the query is posed: Done with all memory instances? If No, then the process returns to block 1008 for the next memory instance. If Yes, then the process proceeds to block 1018 where the conclusion of the current fuse input control vector is noted. If all vectors have not yet been completed, the process proceeds to block 1016 where the current vector enable bit is disabled, after which the process return to block 1004, where another fuse input control vector is selected. Once all vectors have been completed, the validation is complete at block 1020.

Figure 11:
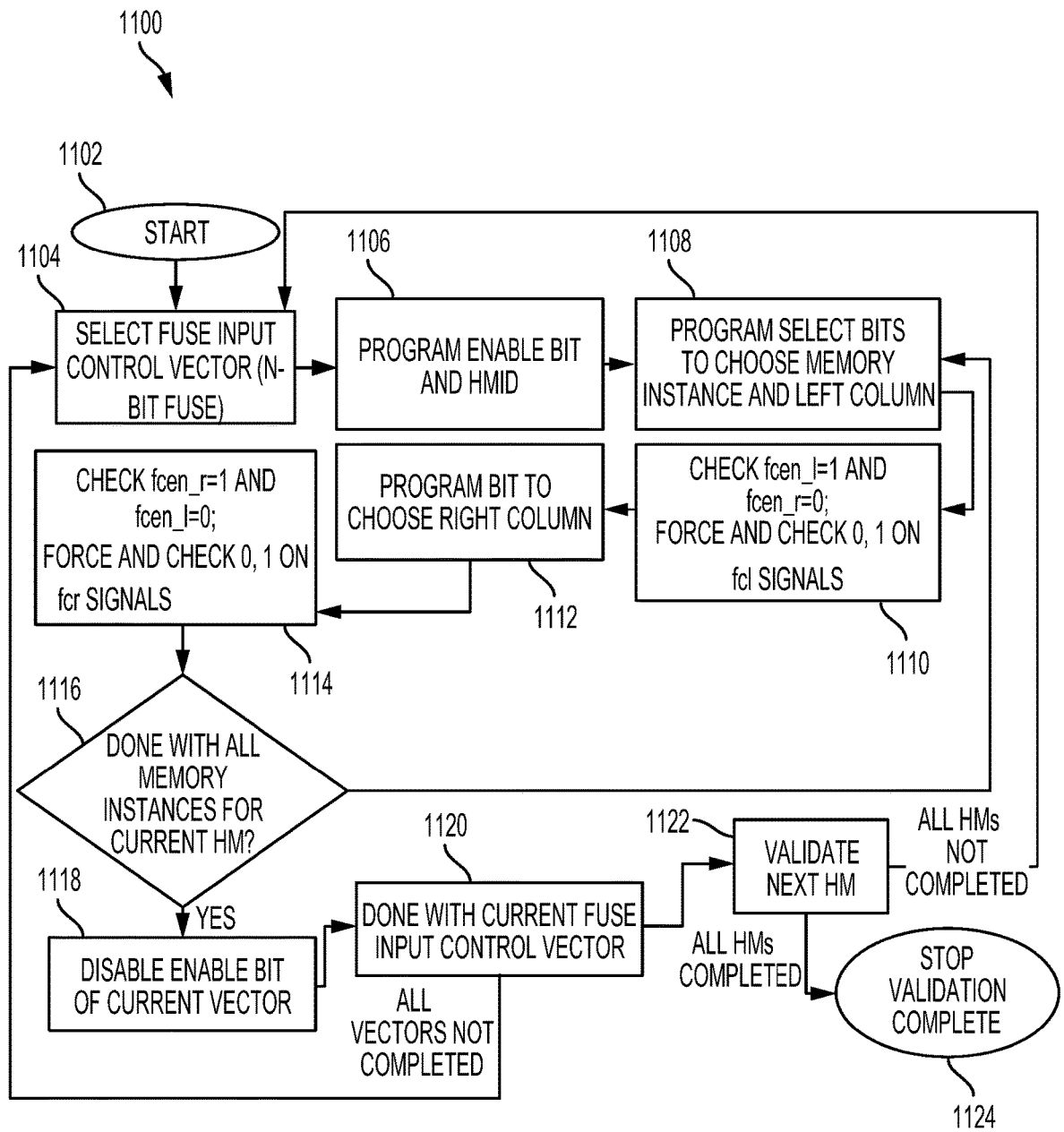
FIG. 11 is a flowchart of a HMID memory repair method, in accordance with embodiments disclosed herein.

FIG. 11 is a flowchart of a HMID based verification flow 1100. The method begins at start block 1102. A fuse input control vector for a N-bit fuse is selected in block 1104. For example, the N-bit fuse may be a 17 bit fuse. In block 1106 the enable bit and HMID are programmed. In block 1108 the select bits are programmed to choose a memory instance and left column. In block 1110, a check is made to ensure that fuse column enable left is set to 1 and to force a check that fuse column enable right is set to 0. In block 1112 a bit is programmed to choose the right fuse column. In block 1114 a check is made to ensure the fuse column enable right is set to 1 and fuse column left is set to 0. At decision block 1116 a check is made as to whether all memory instances have been completed. If No, the process returns to block 1108. If Yes, the process proceeds to block 1118, where the current vector enable bit is disabled. A check is made at block 1120 to determine if the current use input control vector is complete, if not, the process proceeds to block 1104. If so, the process proceeds to block 1122 to validate the next HM. Once all HMs are complete, the process ends at block 1124.

The methods and apparatus provided above improve production yields for SoCs and other devices containing repairable memories. Test time is also reduced, as the number of re-checks of memories is reduced. The method and apparatus also provide faster memory repair during the production process, with less disruption.

It is understood that the specific order or hierarchy of blocks in the processes disclosed is an illustration of exemplary approaches. Based upon design preferences, it is understood that the specific order or hierarchy of blocks in the processes may be rearranged. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for repairing a memory, comprising:
   testing at least one memory, from a plurality of memory, using a production test pattern, each of the plurality of memory including a set of columns and rows;
   determining that at least one memory, from the plurality of memory, has failed;
   determining one or more columns or rows in the at least one failed memory;
   determining a fuse register pattern based on the one or more columns or rows of memory that failed, the fuse register pattern specifying one or more fuses to blow to remap the memory columns or rows in the at least one failed memory to one or more reserved memory columns or rows to repair the failed memory, wherein the plurality of memory is repairable by any of the one or more reserved memory columns or rows; and
   blowing fuses in a fuse register corresponding to the fuse register pattern to remap the columns or rows for the failed memory;
   wherein determining the fuse register pattern comprises selecting a repair vector including an enable field configured to enable blowing of at least one fuse of the column or row of the memory that failed and a select field configured to identify a pointer to at least one location of one or more locations of memory failures.

2. The method of claim 1 further comprising:
   retesting the at least one failed memory using the production test pattern.

3. The method of claim 1, wherein the at least one memory contains a non-hard macro.

4. The method of claim 1, wherein the at least one memory contains at least one hard macro.

5. The method of claim 1 wherein a hard macro is stored in the memory, and wherein the hard macro is associated with at least a subset of the set of columns and rows.

6. The method of claim 1 further comprising: performing a fuse connectivity validation after blowing the fuse.

7. An apparatus for repairing a memory, comprising:
   a semiconductor device having at least one repairable memory;
   a fuse programmable read-only memory (FPROM) containing one or more reserved memory columns and rows; and
   a fuse box memory repair (FMR), in communication with the FRPOM and the at least one repairable memory, the FMR configured to:
   determine one or more columns and rows of memory failures in the at least one repairable memory;
   determine a fuse register pattern based on the one or more columns and rows of the at least one repairable memory that failed, the fuse register pattern specifying one or more fuses to blow to remap the memory columns or rows in the at least one repairable memory to the one or more reserved memory columns or rows to repair the at least one repairable memory, wherein the at least one repairable memory is repairable by any of the one or more reserved memory columns or rows; and
   blow fuses in the FPROM corresponding to the fuse register pattern to remap the columns or rows for the at least one repairable memory;
   wherein the determination of the fuse register pattern includes selection of a repair vector including an enable field that enables blowing of at least one fuse of the column or row of the memory that failed and a select field that identifies a pointer to at least one column or row of the at least one repairable memory.

8. The apparatus of claim 7, wherein the at least one repairable memory contains a non-hard macro.

9. The apparatus of claim 7, wherein the at least one repairable memory contains at least one hard macro.

10. An apparatus comprising:
    means for testing at least one memory using a production test pattern, the at least one memory including a set of columns and rows;
    means for determining that at least one memory has failed;
    means for determining one or more columns or rows in the at least one failed memory;
    means for determining a fuse register pattern based on the one or more columns or rows of the at least one failed memory, the fuse register pattern specifying one or more fuses to blow to remap the memory columns or rows in the at least one failed memory to repair the at least one failed memory, wherein the at least one failed memory is repairable by any of the one or more reserved memory columns or rows; and
    means for blowing fuses in a fuse register corresponding to the fuse register pattern to remap the columns or rows for the at least one failed memory;
    wherein the means for determining the fuse register pattern for the at least one failed memory includes means for selecting a repair vector, wherein the repair vector further includes an enable field to enable blowing of at least one fuse of the column or row of the at least one failed memory and a select field that identifies a pointer to at least one column or row of the failed memory.

11. The apparatus of claim 10, further comprising: means for retesting the at least one failed memory using the production test pattern.

12. The apparatus of claim 10, wherein the at least one memory includes at least one hard macro.

13. The apparatus of claim 10, further comprising: means for enabling hard macro identification.

14. The apparatus of claim 13, wherein the means for enabling hard macro identification enables the hard macro identification when determining a fuse register pattern for the at least one failed memory.

15. The apparatus of claim 10, further comprising: means for performing a fuse connectivity validation after blowing the fuse.

16. The method of claim 1, wherein the plurality of memory are distinct memory arrays which are repairable by a fuse box memory repair (FMR) and the one or more reserved memory columns or rows in a fuse programmable read-only memory (FPROM).

17. The apparatus of claim 7, wherein the FMR further includes a multi-way fuse decoder box that remaps the memory columns or rows in the failed memory to the one or more reserved memory columns or rows by using the fuses in the FPROM.

* * * * *